United States Patent
Huang

(10) Patent No.: US 6,368,923 B1
(45) Date of Patent: Apr. 9, 2002

(54) METHOD OF FABRICATING A DUAL METAL GATE HAVING TWO DIFFERENT GATE DIELECTRIC LAYERS

(75) Inventor: Kuo-Tai Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/561,577

(22) Filed: Apr. 28, 2000

(30) Foreign Application Priority Data

Apr. 20, 2000 (TW) .......................................... 89107440

(51) Int. Cl.$^7$ ........................................ H01L 21/8234
(52) U.S. Cl. ...................... 438/275; 438/258; 438/587; 438/591
(58) Field of Search ................................ 438/188, 195, 438/199, 266, 283, 682, 257, 258, 259, 260, 261, 262, 263, 264, 265, 267, 275, 587, 585, 591; 257/411, 412, 410, 350, 351, 390, 392

(56) References Cited

U.S. PATENT DOCUMENTS

| | | | | |
|---|---|---|---|---|
| 5,960,289 A | * | 9/1999 | Tsui et al. .................... | 438/275 |
| 6,087,229 A | * | 7/2000 | Aronowitz et al. .......... | 438/287 |
| 6,093,590 A | * | 7/2000 | Lou ............................. | 438/197 |
| 6,114,203 A | * | 9/2000 | Ghidini et al. ............... | 438/258 |
| 6,133,130 A | * | 10/2000 | Lin et al. ..................... | 438/586 |
| 6,140,185 A | * | 10/2000 | Kimura ........................ | 438/275 |
| 6,165,849 A | * | 12/2000 | An et al. ...................... | 438/275 |
| 6,184,072 B1 | * | 2/2001 | Kaushik et al. .............. | 438/197 |
| 6,184,114 B1 | * | 2/2001 | Lukanc ......................... | 438/585 |
| 6,200,865 B1 | * | 3/2001 | Gardner et al. .............. | 438/291 |
| 6,221,712 B1 | * | 4/2001 | Huang et al. ................ | 438/240 |
| 6,291,282 B1 | * | 9/2001 | Wilk et al. ................... | 438/203 |

* cited by examiner

*Primary Examiner*—Wael Fahmy
*Assistant Examiner*—Fernando Toledo

(57) ABSTRACT

A method of fabricating a dual metal gate. A cell region and a peripheral region are formed on a substrate, and a first dummy gate electrode and a second dummy gate electrode are formed on the substrate, respectively, in the cell region and in the peripheral region. A patterned first dielectric layer is formed above the substrate, and the layer exposes the surfaces of the first dummy gate electrode and the second dummy gate electrode. The first dummy gate electrode and the second dummy gate electrode are then removed to expose the substrate, and an oxide layer is formed on the exposed substrate in the peripheral region. A remote plasma nitridation step is performed to nitridate the surface of the exposed substrate in the cell region and to nitridate the oxide layer into a material layer in the peripheral region. A second dielectric layer and a conducting layer are formed sequentially above the substrate. The conducting layer fills up the trenches that are formed by removing the first dummy gate electrode and the second dummy gate electrode. A part of the second dielectric layer and a part of the conducting layer are removed until the surface of the first dielectric layer is exposed, and a dual metal gate is completed thereon.

24 Claims, 4 Drawing Sheets

METHOD OF FABRICATING A DUAL METAL GATE HAVING TWO DIFFERENT GATE DIELECTRIC LAYERS

CROSS-REFERENCE TO RELATED APPLICATION

This application claims the priority benefit of Taiwan application serial no. 89107440, filed Apr. 20, 2000.

BACKGROUND OF THE INVENTION

1. Field of Invention

The present invention relates to a method of fabricating integrated circuits. More particularly, the present invention relates to a method of fabricating a dual metal gate.

2. Description of Related Art

In the present semiconductor manufacture processes, the integration required for integrated circuits is higher and the sizes of field effect transistors (FET) are smaller. When the size of the field effect transistor is less than 0.1 micron, the thickness of the gate oxide layer is less than about 20 Angstroms, that is, about six to seven layers of silicon oxide in a gate silicon oxide layer. Because the gate silicon oxide layer is pretty thin, electrons can easily diffuse through the gate silicon oxide layer and cause current leakage; furthermore, dopants might penetrate the gate silicon oxide layer through the defects and cause problems in electrical properties.

The thickness of the gate silicon oxide layer limits the size of the field effect transistor. In order to solve the problems caused by the gate silicon oxide layer, many dielectric materials with high dielectric constants are developed. These dielectric materials include: $Ta_2O_5$, $Pb(Zr, Ti)O_3$ (PZT) and $(Ba, Sr)TiO_3$ (BST), with dielectric constants of about 20–25 for $Ta_2O_5$, about 20–60 for BST and about 600–1000 for PZT.

However, a dielectric layer with a high dielectric constant cannot remain the original high dielectric constant, because a native oxide layer that has a lower dielectric constant is formed between the silicon substrate and the dielectric layer. This further influences the electrical performance of the minute transistor formed thereon.

As the thickness of the gate oxide layer decreases, poly depletion becomes more severe. Presently, metal gates replace polysilicon gates to prevent poly depletion and to reduce parasitic resistance. Moreover, the gate oxide layer in the peripheral region must be thicker than the gate oxide layer in the cell region, in order to increase breakdown voltage for outside circuit connections. In order to use dielectric materials with high dielectric constants for gate oxide layers in the metal gates, many difficulties must be overcome to achieve different thickness requirements for gate oxide layers in the cell region and the peripheral region and to increase the effective thickness of gate oxide layers for the high-integration IC manufacture process.

SUMMARY OF THE INVENTION

The invention provides a method of fabricating a dual metal gate. A substrate containing a cell region and a peripheral region is provided and a first dummy gate electrode and a second dummy gate electrode are formed on the substrate, respectively, in the cell region and in the peripheral region. Below the sidewalls of the first dummy gate electrode and the second dummy gate electrode, source/ drains are formed in the substrate. A patterned first dielectric layer is formed above the substrate, and the layer exposes the surfaces of the first dummy gate electrode and the second dummy gate electrode. The first dummy gate electrode and the second dummy gate electrode are then removed to expose the substrate and an oxide layer is formed on the exposed substrate in the peripheral region. A remote plasma nitridation (RPN) step is performed to nitridate the surface of the exposed substrate in the cell region and to nitridate the oxide layer into a material layer in the peripheral region. A conformal second dielectric layer is formed above the substrate. A conducting layer is formed on the second dielectric layer and fills up trenches that are formed by removing the first dummy gate electrode and the second dummy gate electrode. A part of the second dielectric layer and a part of the conducting layer are removed until the surface of the first dielectric layer is exposed and a dual metal gate is completed thereon.

As embodied and broadly described herein, the RPN step is performed in an environment full of ammonia plasma or nitrogen plasma, at a temperature of about 500–800 degrees Centigrade, with a pressure less than 30 Torr, a plasma operation power of about 1000–5000 Watts and for a duration of about 30–90 seconds. Furthermore, metal silicides are formed on source/drains.

In this invention, a nitridation step is performed to nitridate the surfaces of the substrate and the surface of the oxide layer that are exposed by the trenches; therefore, the gate dielectric layer that is subsequently formed can maintain a higher dielectric constant. Moreover, gate dielectric layers of different thicknesses are formed respectively in the cell region and in the peripheral region (the effective thickness of the gate dielectric layer in the cell region is the sum of the thicknesses of the dielectric layer and the nitride layer, while the effective thickness of the gate dielectric layer in the peripheral region is the sum of the thicknesses of the dielectric layer and the material layer). Thus, this satisfies the requirement for a higher breakdown voltage in the peripheral region.

In this invention, metal gate layers are formed after metal silicide layers are formed on the source/drains; hence, the thermal budget of the manufacture process is reduced. The manufacture process of this invention is compatible with the prior art manufacture process for the gate dielectric layer; therefore, the manufacture processes can easily be integrated. In this invention, metal gate layers are formed after the source/drains are formed; therefore, the heat diffusion in the thermal process for forming source/drains does not result in contamination in the metal gate layers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
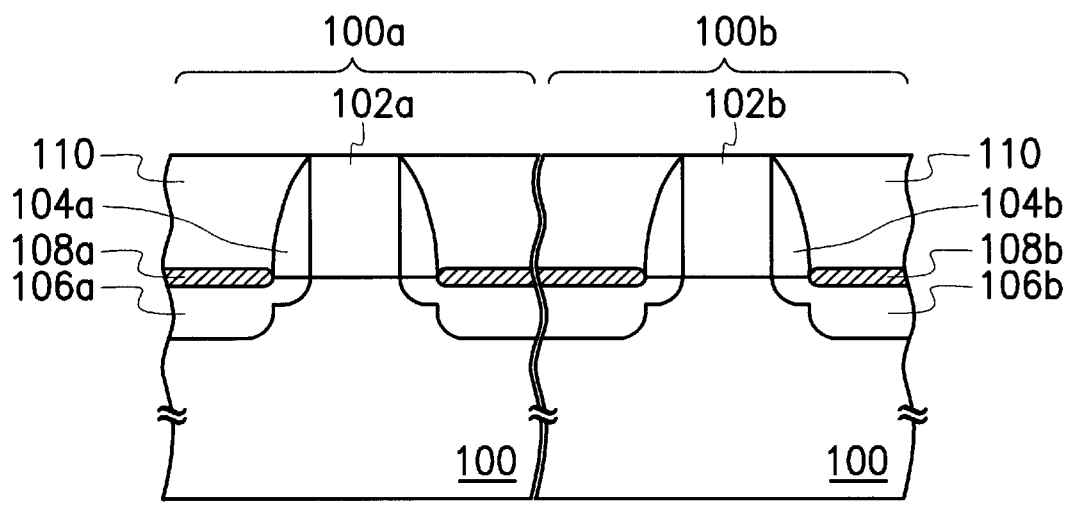
FIGS. 1A to 1G are schematic, cross-sectional views illustrating the processes for fabricating a dual metal gate according to one preferred embodiment of this invention.

Referring to FIG. 1A, a substrate 100 is provided. The substrate is, for example, a semiconductor silicon substrate.

Substrate 100 contains a cell region 100a and a peripheral region 100b. In cell region 100a, a dummy gate electrode 102a is formed on substrate 100; a spacer 104a is formed on the sidewalls of dummy gate electrode 102a; a source/drain 106a is formed in substrate 100 beside spacer 104a and a metal silicide layer 108a is formed on source/drain 106a. In cell region 100b, a dummy gate electrode 102b is formed on substrate 100; a spacer 104b is formed on the sidewalls of dummy gate electrode 102b; a source/drain 106b is formed in substrate 100 beside spacer 104b and a metal silicide layer 108b is formed on source/drain 106b.

A planarized dielectric layer 110 is formed above substrate 100, exposing the surfaces of dummy gate electrodes 102a, 102b. The step for forming dielectric layer 110 comprises forming a dielectric layer (not shown here) made of, for example, silicon oxide, above substrate 100 and removing a part of dielectric layer by, for example, chemical mechanical polishing, until the surfaces of the dummy gate electrodes are exposed.

Figure 1B:
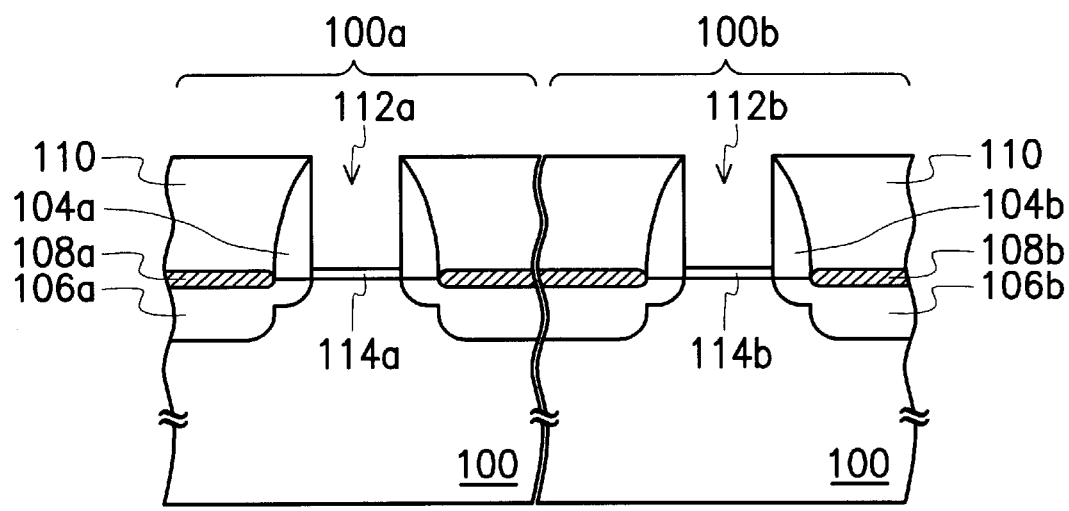

Referring to FIG. 1B, dummy gate electrodes 102a, 102b are removed to form trenches 112a and 112b in cell region 100a and peripheral region 100b, respectively. An oxidation step is performed to form oxide layers 114a and 114b, respectively, in trenches 112a and 112b on exposed substrate 100. The oxidation step comprises a rapid thermal process in an environment full of oxygen, $N_2O$ and NO, at a temperature of about 600–900 degrees Centigrade for a duration of about 5–60 seconds. Oxide layers 114a and 114b are formed thereon with a thickness of less than 15 Angstroms.

Figure 1C:
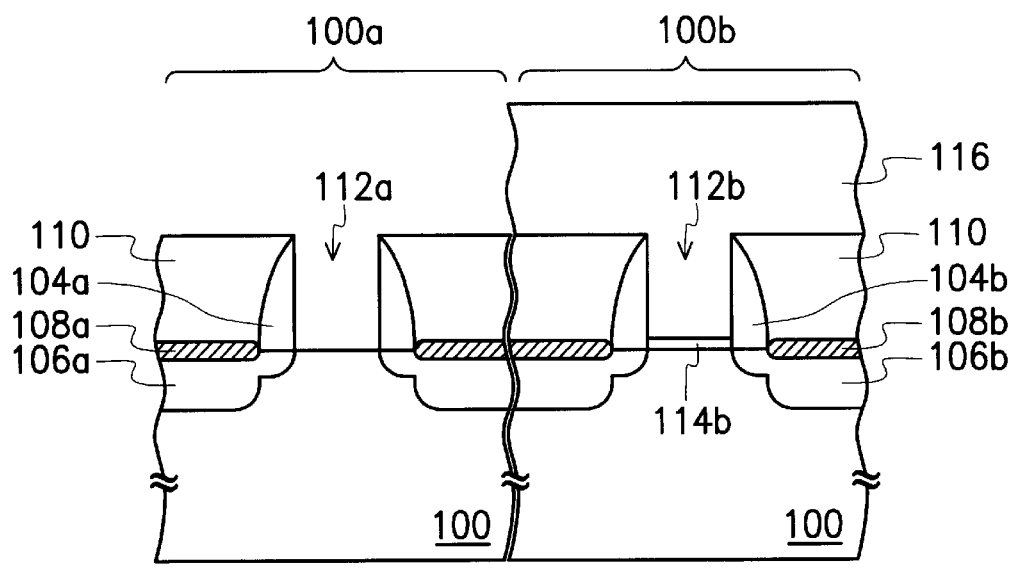

Referring to FIG. 1C, a patterned photoresist layer 116 is formed above substrate 100 to cover peripheral region 100b. Patterned photoresist layer 116 does not cover cell region 100a, and oxide layer 114a inside trench 112a is exposed. Oxide layer 114a is removed to expose the surface of substrate 100 by, for example, wet etching with a solution containing hydrogen fluoride.

Figure 1D:
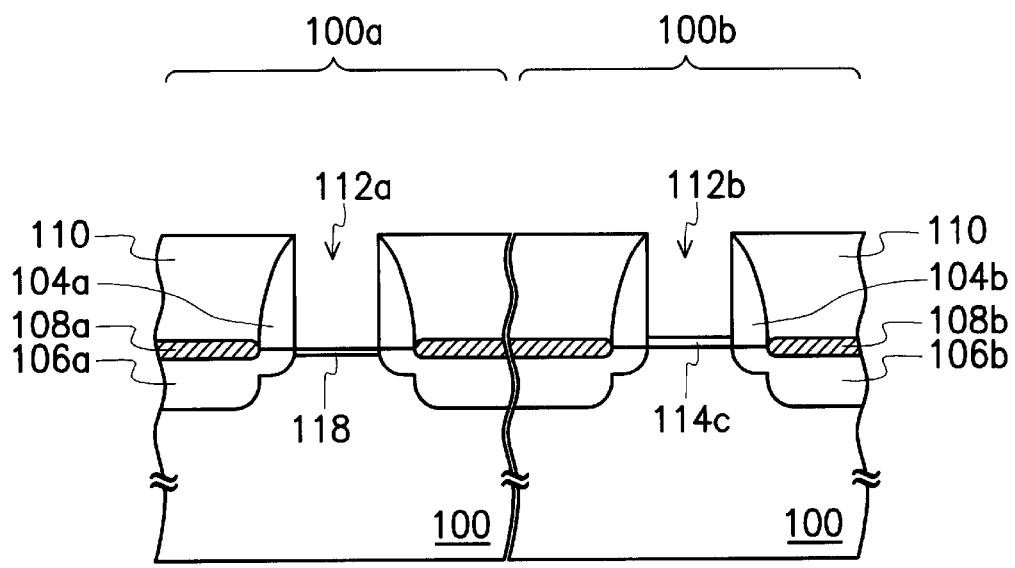

Referring to FIG. 1D, photoresist layer 116 is removed to expose oxide layer 114b inside trench 112b in peripheral region 100b. A nitridation step is performed to nitridate the surface of oxide layer 114b into a material layer 114c in trench 112b and to form a nitride layer 118 on the surface of substrate 100 in trench 112a. Material layer 114c has a thickness less than 20 Angstroms, and nitride layer 118 has a thickness less than 10 Angstroms. A preferable process for the nitridation step is RPN. RPN is performed in an environment full of ammonia plasma or nitrogen plasma, at a temperature of about 500–800 degrees Centigrade, with a pressure less than 30 Torr, a plasma operation power of about 1000–5000 Watts and for a duration of about 30–90 seconds. RPN is performed to nitridate silicon atoms on the surfaces of substrate 100 in trench 112a and of oxide layer 114b in trench 112b into silicon nitride or silicon-oxynitride.

Figure 1E:
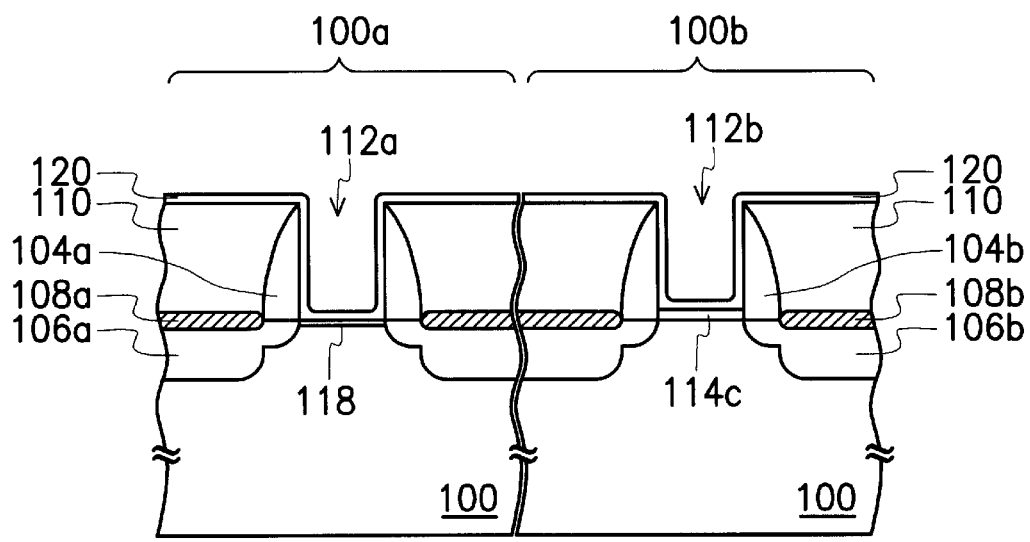

Referring to FIG. 1E, a conformal dielectric layer 120 is formed as a gate dielectric layer. Dielectric layer 120 consists of a material with a high dielectric constant, such as, silicon nitride, $Ta_2O_5$, $Ta_{2-x}Ti_xO_5$ or titanium nitride, formed by chemical vapor deposition (CVD).

Because dielectric layer 120 has a high dielectric constant, the effective thickness of dielectric layer 120 is greater. Therefore, the prior art problems that are caused by an overly thin gate oxide layer, such as current leakage in the gate and boron penetration, can be solved.

Before dielectric layer 120 is formed, the nitridation step is performed to nitridate the surfaces of substrate 100 and oxide layer 114b to form nitride layer 118 in trench 112a and material layer 114c in trench 112b, respectively. Therefore, native oxide layers are prevented from forming on the surfaces of substrate 100 and oxide layer 114b. This further maintains the dielectric constant and the effective thickness of dielectric layer 120 formed thereon.

Oxide layer 114a inside trench 112a in cell region 100a is removed before forming dielectric layer 120; therefore, the thickness of dielectric layer 120 and the thickness of nitride layer 118 add up to the effective thickness of the gate dielectric layer in cell region 100a. On the other hand, the thickness of dielectric layer 120 and the thickness of material layer 114c add up to the effective thickness of the gate dielectric layer in peripheral region 100b. Consequently, the effective thickness of the gate oxide layer in cell region 100a is less than the effective thickness of the gate oxide layer in peripheral region 100b, which satisfies the requirement of higher breakdown voltage for the peripheral region to connect with outside circuits as an input/output.

Figure 1F:
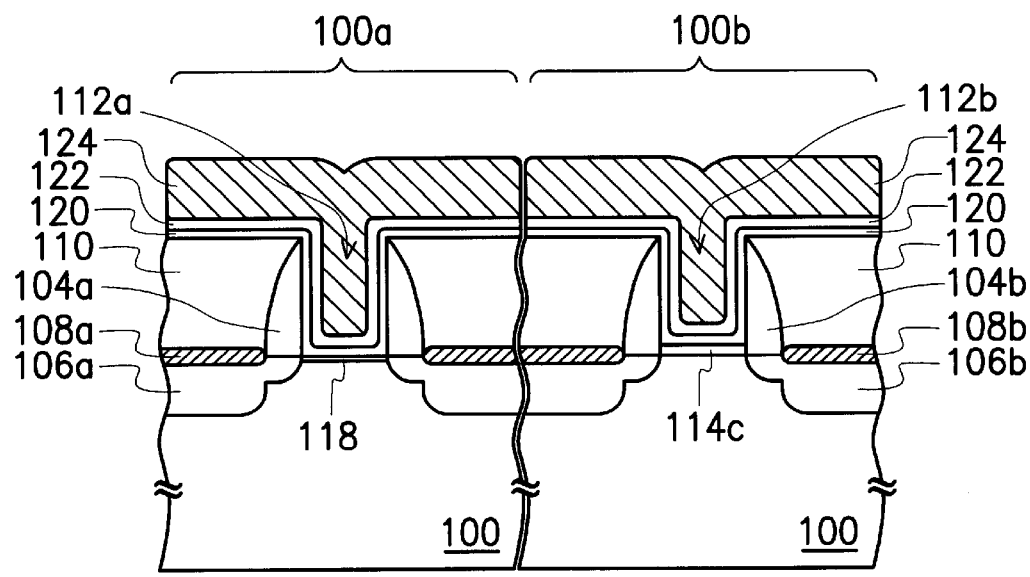

Referring to FIG. 1F, after dielectric layer 120 is formed, a conformal barrier layer 122 and a conducting layer 124 are formed sequentially on substrate 100. Conducting layer 124 fills up trenches 112a and 112b. Barrier layer 122 protects underlying dielectric layer 120 from contacting the conducting material when conducting layer 124 is later formed. A material for barrier layer 122 comprises titanium nitride, tantalum nitride or tungsten nitride and is formed by sputtering. Conducting layer 124 is, for example, a tungsten metal layer that is formed by sputtering.

Figure 1G:
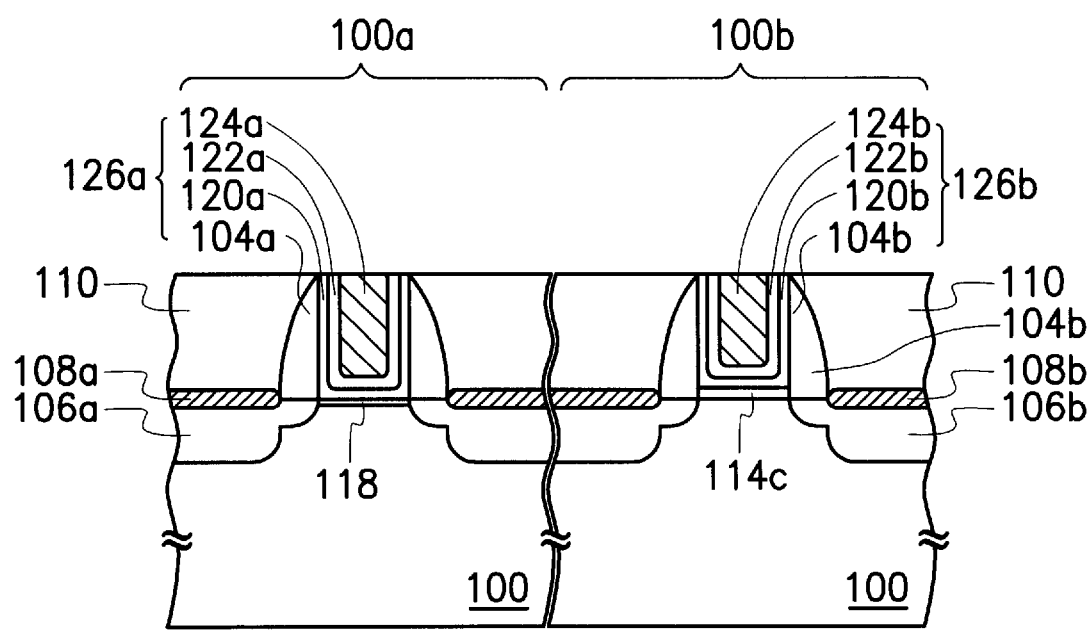

Referring to FIG. 1G, a part of dielectric layer 120, barrier layer 122 and conducting layer 124 are removed until the surface of dielectric layer 110 is exposed. A gate 126a that includes a dielectric layer 120a, a barrier layer 122a, a metal gate layer 124a and nitride layer 118 is formed thereon in cell region 100a. A gate 126b that includes a dielectric layer 120b, a barrier layer 122b, a metal gate layer 124b and material layer 114c is formed thereon in peripheral region 100b.

Metal silicide layers 108a and 108b are formed respectively on source/drains 106a and 106b before metal gate layers 124a and 124b are formed; therefore, the thermal budget of the manufacture process can be reduced. Metal gate layers 124a and 124b are formed after source/drains 106a and 106b are formed; therefore, the heat diffusion in the thermal process for forming source/drains 106a and 106b does not result in contamination in metal gate layers 124a and 124b.

As described broadly herein, this invention has the following advantages:

1. In this invention, a nitridation step is performed to nitridate the surfaces of the substrate and the surface of the oxide layer that are exposed by the trenches; therefore, the gate dielectric layer subsequently formed can maintain a higher dielectric constant.

2. In this invention, gate dielectric layers of different thicknesses are formed respectively in the cell region and in the peripheral region, so the requirement for a higher breakdown voltage in the peripheral region is satisfied.

3. In this invention, metal gate layers are formed after metal silicide layers are formed on the source/drains; hence, the thermal budget of the manufacture process is reduced.

4. The manufacture process of this invention is compatible with the prior art manufacture process for the gate dielectric layer; therefore, the manufacture processes can easily be integrated.

5. In this invention, metal gate layers are formed after source/drains are formed; therefore, the heat diffusion in the thermal process for forming source/drains does not result in contamination in the metal gate layers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dual metal gate, comprising:

forming a cell region and a peripheral region in a provided substrate, wherein a first dummy gate electrode and a second dummy gate electrode are formed on the substrate, respectively, in the cell region and in the peripheral region, and source/drains are formed in the substrate below the sidewalls of the first dummy gate electrode and the second dummy gate electrode;

forming a patterned first dielectric layer above the substrate, which layer exposes surfaces of the first dummy gate electrode and the second dummy gate electrode;

removing the first dummy gate electrode and the second dummy gate electrode to expose the substrate;

forming an oxide layer on the exposed substrate in the peripheral region;

performing a remote plasma nitridation step to nitridate the surface of the oxide layer into a material layer in the peripheral region and to nitridate the exposed surface of the substrate in the cell region;

forming a conformal second dielectric layer above the substrate;

forming a conducting layer on the second dielectric layer, wherein the conducting layer fills up trenches that are formed by removing the first dummy gate electrode and the second dummy gate electrode; and removing a part of the second dielectric layer and a part of the conducting layer until the surface of the first dielectric layer is exposed.

2. The method as claimed in claim 1, wherein the remote plasma nitridation step is performed at a temperature of about 500 to about 800 degrees Centigrade, with a pressure less than 30 Torr and for a duration of about 30 to about 90 seconds.

3. The method as claimed in claim 1, wherein a plasma used in the remote plasma nitridation step comprises an ammonia plasma performed with an operation power of about 1000 to about 5000 Watts.

4. The method as claimed in claim 1, wherein a plasma used in the remote plasma nitridation step comprises a nitrogen plasma performed with an operation power of about 1000 to about 5000 Watts.

5. The method as claimed in claim 1, wherein the step for forming the second dielectric layer comprises chemical vapor deposition.

6. The method as claimed in claim 1, wherein the dielectric constant of the second dielectric layer is larger than the dielectric constant of silicon oxide.

7. The method as claimed in claim 1, wherein a material for the second dielectric layer comprises a material selected from the group consisting of silicon nitride, tantalum oxide, $Ta_{2-x}Ti_xO_5$ and titanium nitride.

8. The method as claimed in claim 1, wherein the step for forming the oxide layer is performed at a temperature of about 600 to about 900 degrees Centigrade, with a duration of about 5 to about 60 seconds.

9. The method as claimed in claim 1, comprising a metal silicide being formed on the source/drain.

10. The method as claimed in claim 1, comprising a barrier layer being formed on the second dielectric layer before formation of the conducting layer.

11. The method as claimed in claim 1, wherein a material for the conducting layer comprises tungsten metal.

12. A method of fabricating a dual metal gate, wherein a substrate containing a cell region and a peripheral region is provided, a first dielectric layer being formed above the substrate and exposing a first trench and a second trench inside the substrate respectively in the cell region and in the peripheral region, and source/drains being formed, respectively, in the substrate below sidewalls of the first trench and the second trench, the method comprising:

forming an oxide layer on the substrate exposed by the second trench;

performing a nitridation step to nitridate the exposed surface of the substrate in the first trench and the surface of the oxide layer in the second trench;

forming a conformal second dielectric layer above the substrate;

forming a conducting layer on the second dielectric layer, wherein the conducting layer fills up the first trench and the second trench; and removing a part of the second dielectric layer and a part of the conducting layer until the surface of the first dielectric layer is exposed.

13. The method as claimed in claim 12, wherein the nitridation step comprises a remote plasma nitridation step.

14. The method as claimed in claim 13, wherein the remote plasma nitridation step is performed at a temperature of about 500 to about 800 degrees Centigrade, with a pressure less than 30 Torr and for a duration of about 30 to about 90 seconds.

15. The method as claimed in claim 13, wherein a plasma used in the remote plasma nitridation step comprises an ammonia plasma.

16. The method as claimed in claim 15, wherein the ammonia plasma used in the remote plasma nitridation step is performed with an operation power of about 1000 to about 5000 Watts.

17. The method as claimed in claim 13, wherein a plasma used in the remote plasma nitridation step comprises a nitrogen plasma.

18. The method as claimed in claim 17, wherein the nitrogen plasma used in the remote plasma nitridation step is performed with an operation power of about 1000 to about 5000 Watts.

19. The method as claimed in claim 12, wherein the step for forming the second dielectric layer comprises chemical vapor deposition.

20. The method as claimed in claim 12, wherein the dielectric constant of the second dielectric layer is larger than the dielectric constant of silicon oxide.

21. The method as claimed in claim 12, wherein a material for the second dielectric layer comprises a material selected from the group consisting of silicon nitride, tantalum oxide, $Ta_{2-x}Ti_xO_5$ and titanium nitride.

22. The method as claimed in claim 12, wherein the step for forming the oxide layer is performed at a temperature of about 600 to about 900 degrees Centigrade, with a duration of about 5 to about 60 seconds.

23. The method as claimed in claim 12, comprising a barrier layer being formed on the second dielectric layer before formation of the conducting layer.

24. The method as claimed in claim 12, wherein a material for the conducting layer comprises tungsten metal.

* * * * *